(12) United States Patent
Johnson

(10) Patent No.: US 6,906,578 B2
(45) Date of Patent: Jun. 14, 2005

(54) CONTROL LOOP COMPENSATION CIRCUIT AND METHOD

(75) Inventor: Gerald H. Johnson, Andover, MN (US)

(73) Assignee: Teradyne, Inc., Boston, MA (US)

(*) Notice: Subject to any disclaimer, the term of this patent is extended or adjusted under 35 U.S.C. 154(b) by 166 days.

(21) Appl. No.: 10/000,440

(22) Filed: Oct. 30, 2001

(65) Prior Publication Data

US 2003/0080771 A1 May 1, 2003

(51) Int. Cl.[7] .............................. G05F 1/10; G05F 3/02
(52) U.S. Cl. ..................................................... 327/538
(58) Field of Search ................................. 327/530, 538, 327/540, 541, 543

(56) References Cited

U.S. PATENT DOCUMENTS 5,504,452 A * 4/1996 Takenaka ..................... 327/541
5,945,818 A * 8/1999 Edwards ...................... 323/273
6,281,744 B1 * 8/2001 Kang ........................... 327/541

* cited by examiner

Primary Examiner—Quan Tra

(57) ABSTRACT

A control loop circuit is disclosed for optimizing a power supply output under varying load conditions. The power supplye has a main loop amplifier and an output stage to generate the output. The control loop circuit includes a static control path coupled to the output and having an error amplifier. The error amplifier is operative to generate an error signal for presentation to the main loop amplifier where the error signal represents the difference between a desired output and a sensed output. A dynamic control path is coupled to the error amplifier output and is responsive to the error signal to generate a dynamic compensation signal. The dynamic control path has an output coupled to the main loop amplifier output.

14 Claims, 3 Drawing Sheets

CONTROL LOOP COMPENSATION CIRCUIT AND METHOD

FIELD OF THE INVENTION

The invention relates generally to automatic test equipment and more particularly a control loop circuit and method for a high speed and high accuracy power supply for use with a semiconductor tester.

BACKGROUND OF THE INVENTION

Modem integrated circuits (ICs) operate according to strictly defined electrical parameters. In order to stay within those parameters, ICs need an accurate and responsive source of power in the form of device power supplies. These electronic assemblies typically implement control circuitry to minimize changes in the output due to a variety of factors.

The current demand by an IC often varies between high and low extremes during operation. Under these conditions, it is important that the supply voltage to the IC remain as constant as possible during these current load swings. In order to minimize supply voltage changes, conventional design considerations involve varying two factors. First, a large amount of capacitance is often placed near the IC to supply near instantaneous current, when needed. Second, the device power supply is typically optimized to respond to the change in current demand as rapidly as possible.

For automatic test equipment (ATE) applications, the power supply is typically called a device-under-test (DUT) power supply. In this context, the DUT acts as a load on the tester. For modem DUTs, such as VLSI microprocessors, operation typically demands relatively high currents during a test. The current required by the DUT may vary from very low to very high values during a very short period of time (nanoseconds).

DUT power supply manufacturers often optimize the response of the power supply control loop by sensing the voltage at the DUT and feeding it back to an error amplifier to generate an error signal at the power supply control amplifier. While this technique often optimizes the response to a certain degree, an end user of the power supply often has the freedom to change the amount of capacitance located near the DUT. Moreover, the load itself may have a wide range of selectable current steps. As a result, it is difficult for the power supply manufacturer to predict the optimal control loop performance for all possible combinations.

Typical DUT power supplies often include a main loop amplifier that drives one or more output stages. A control loop is established through sense lines that feed the power supply output back to the error amplifier. The error amplifier compares the actual output to the desired output and provides an error signal to the main loop amplifier to adjust the output accordingly.

Conventional power supply compensation methods to smooth overshoot or undershoot responses typically focus on the main loop amplifier. This has classically been a first order compensation scheme employing a single resistor and capacitor in series between the amplifier output and its negative input. Different compensations to optimize the error signal are achieved by changing the values of the resistor and capacitor. Older conventional schemes typically employed a single compensation setting that often compromised performance. Newer conventional schemes have employed from two to eight selectable settings.

However, for any given conventional compensation, it's only optimized for a given combination of load resistance and capacitance. The load (DUT) produces an error signal with a change in voltage per change in time (dv/dt) that's a direct function of the load current, load capacitance, other parasitics, and power supply response time. The supply response time is included since it responds during the droop time.

As noted above, at any given time, the dv/dt is a function of load current, capacitance current and supply current. Initially the load current is supplied from the capacitance. Over time, the power supply starts to share in this current supply to the load. Eventually, the supply provides all the load current. This is a dynamically changing dv/dt for a given set of load, capacitance and loop compensation. The compensation, however, is not dynamic. It only responds in one way, dictated by the RC values selected.

Another problem with conventional DUT power supplies involves the possibility that an end user may select the improper compensation setting. This may lead to full power oscillation of the power supply outputs, and cause destruction of device-interface-boards (DIBs), VLSI parts, and DIB capacitors.

What is needed and heretofore unavailable is a high-accuracy device power supply for both ATE and non-ATE applications capable of addressing the compensation problem without compromising performance and accuracy. The control loop circuit and method of the present invention satisfies this need.

SUMMARY OF THE INVENTION

The control loop circuit and method of the present invention provides a way to automatically compensate for changing load conditions during semiconductor device operation. This maximizes power supply performance and accuracy, correspondingly maximizing device operation.

To realize the foregoing advantages, the invention in one form comprises a control loop circuit for optimizing a power supply output under varying load conditions. The power supply has a main loop amplifier and an output stage to generate the output. The control loop circuit includes a first control path having a predetermined level of linear compensation. The first control path is coupled to the output and has an error amplifier. The error amplifier is operative to generate an error signal for presentation to the main loop amplifier where the error signal represents the difference between a desired output and a sensed output. A second control path is coupled to the error amplifier output and is responsive to the error signal to generate a dynamic compensation signal. The second control path has an output coupled to the main loop amplifier output.

In another form, the invention comprises a power supply system including a main loop amplifier circuit and an output stage disposed in cascade with the main loop amplifier circuit. The system also includes a control loop circuit including a first control path having a predetermined level of linear compensation. The first control path is coupled to the output stage and has an error amplifier. The error amplifier is operative to generate an error signal for presentation to the main loop amplifier, the error signal representing the difference between a desired output and a sensed output. A second control path is coupled to the error amplifier output and is responsive to the error signal to generate a dynamic compensation signal, the second control path having an output coupled to the main loop amplifier output.

In yet another form the invention comprises a method of controlling the output of a DUT power supply. The method includes the steps of generating a statically compensated error signal based on the difference between the desired power supply output and the actual power supply output; producing a dynamically compensated error signal in parallel with the statically compensated error signal; and summing the statically compensated error signal and the dynamically compensated error signals to create an optimal compensation signal.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
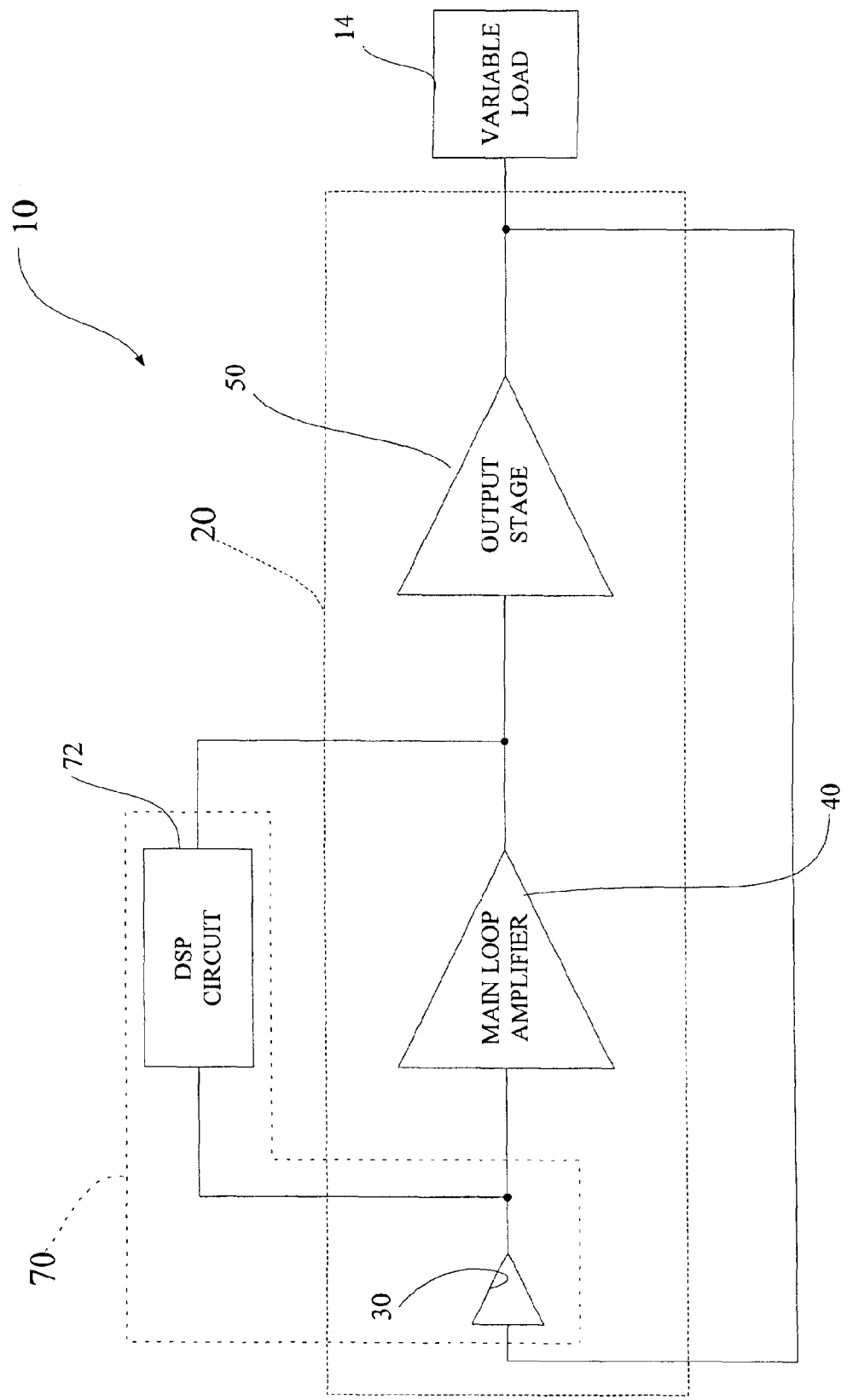
FIG. 1 is a simplified block diagram of a control loop apparatus according to one form of the present invention.

Control circuitry plays an important role in the ability of a high-accuracy power supply to maintain a desired voltage to a varying load under operating conditions. With reference to FIG. 1, the control circuit of the present invention, generally designated 10, provides automatic optimal control compensation for powering a load 12 by combining a first control loop 20 having a pre-set level of linear compensation with a compensation-programmable second control loop 70. This unique combination avoids fixed compensation settings and automatically adjusts the compensation to minimize manual input and errors.

Generally, and further referring to FIG. 1, the first control loop 20 includes a main loop amplifier circuit 40 cascaded with an output stage circuit 50. An error amplifier circuit 30 feeds back the output from the output stage circuit to the input of the main loop amplifier circuit. The second control loop 70 also employs the error amplifier for its initial error signal and a digital-signal-processor (DSP) circuit 72 that is disposed in parallel with the main loop amplifier circuit.

Figure 2:
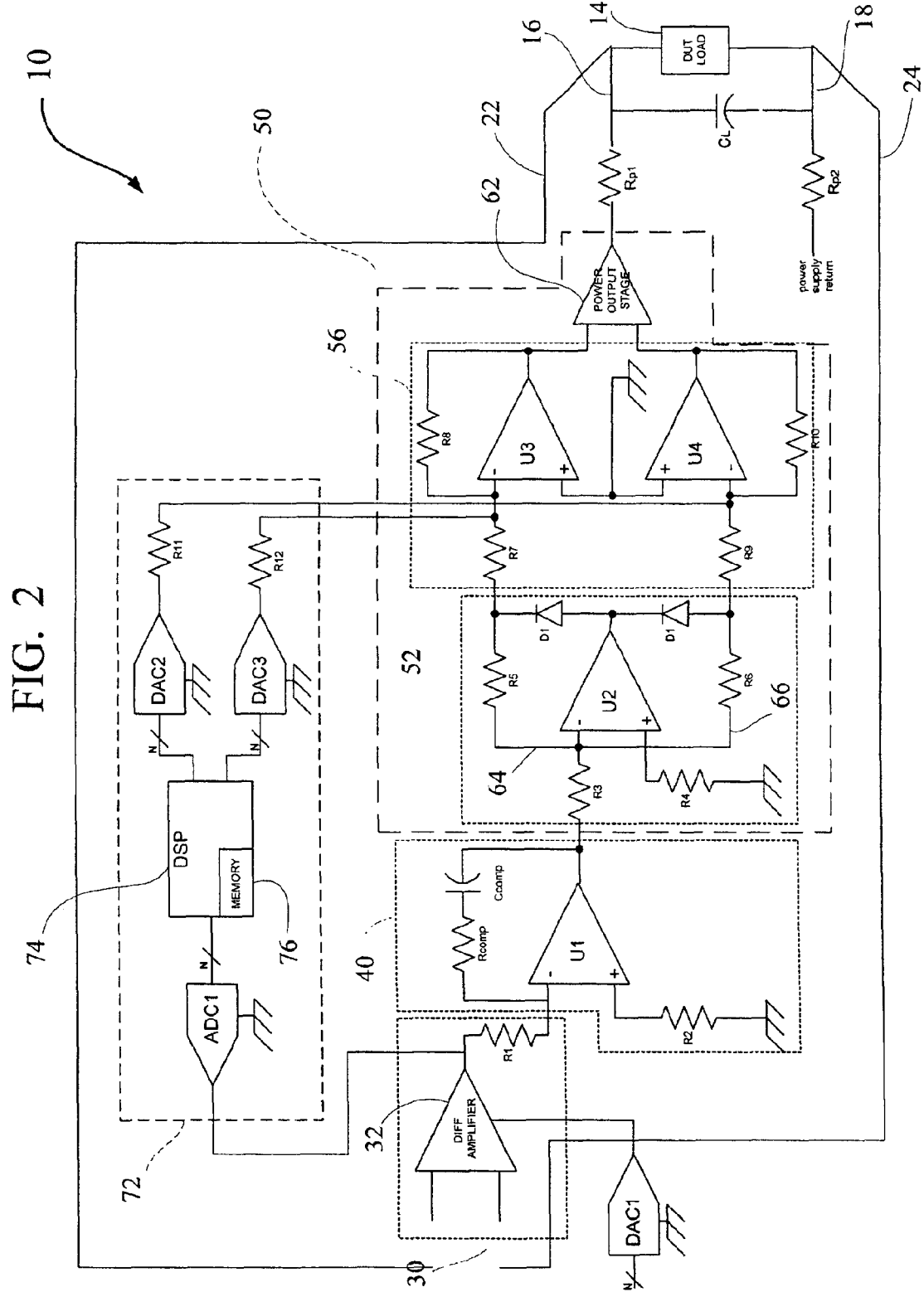
FIG. 2 is a more detailed block diagram of the control loop apparatus of FIG. 1.

In further detail, and referring now to FIG. 2, the control circuit 10 of the present invention monitors the variably changing output from the DUT load 14. The load receives power from the supply through respective positive and negative force lines 16 and 18 that include parasitic resistances $R_{p1}$ and $R_{p2}$, and a load capacitance $C_L$. Respective positive and negative sense lines 22 and 24 are coupled to the force lines and provide a feedback path for the input of the error amplifier circuit 30.

Further referring to FIG. 2, the error amplifier circuit 30 comprises a differential amplifier 32 with an output resistance R1. One input of the amplifier is coupled to the positive sense line 22, and the other input coupled to the negative sense line 24. A digital-analog-converter DAC1 provides the error amplifier with an analog reference voltage corresponding to the desired digitally programmed power supply output voltage setting.

The main loop amplifier circuit 40 includes an operational amplifier U1 having an inverting (−) input disposed at the output of the error amplifier circuit 30. A series connection of resistor $R_{comp}$ and capacitor $C_{comp}$ forms a negative feedback path for a pre-set linear compensation depending on the values of $R_{comp}$ and $C_{comp}$, as is well known in the art.

The output stage circuit 50 receives the output of the main loop amplifier circuit 40, and comprises a rectifier 52, driver circuitry 56, and an output stage amplifier 62. The rectifier includes an op-amp U2 biased by resistors R3 and R4, and having respective source and sink signal paths 64 and 66. The source signal path includes resistor R5 while the sink signal path includes resistor R6. The paths are selectively activated by oppositely disposed diodes D1 and D2 having anode and cathode respectively connected to the op amp U2 output, and cathode and anode respectively tied to the respective resistors. The source and sink signal paths feed the driver circuitry 56 comprising respective source and sink drivers U3 and U4. Each driver has respective gain resistors R7, R8 and R9, R10 for defining the driver gain for the signal fed to the power output stage 62. The output of the power output stage is then fed through the parasitic resistance $R_{p1}$ and load capacitance CL to the DUT.

The inventors have discovered that by adding the second control loop in parallel with the statically compensated first control loop, changes in compensation to the error signal to provide optimal performance may be automatically provided without external manual intervention. As noted briefly above, the second control loop 70 includes a DSP circuit 72. The DSP circuit includes a digital signal processor 74 and memory 76 (either on or off-chip) for storing look-up tables, algorithms, and the like. An analog-to-digital converter ADC1 is coupled to the output of the error amplifier 32 to sample the analog error signal and present it in digital form to the DSP circuit. An inverse setup is provided at the DSP output with a pair of digital-to-analog converters DAC1 and DAC2 to convert digital source or sink signals to analog waveforms for presentation through resistors R11 and R12 to the negative inputs of the drivers U3 and U4.

In operation, the force signal converter DAC1 provides the desired supply voltage level to the error amplifier circuit 30. Changes in current demand by the DUT 14 are sensed along the sense lines 22 and 24 to the inputs of the error amplifier 32, and the actual level compared to the desired level. The difference is then fed to the rest of the first control loop 20, and the second control loop 70 simultaneously.

The main loop amplifier circuit 40 acts on the error signal to provide the pre-set level of linear compensation defined by the values of Rcomp and Ccomp. The resulting signal is then fed through to the rectifier 52 and directed along either the source or sink signal path 64 or 66, depending on the signal polarity. This linear compensation signal from the first control loon is then augmented with a dynamic compensation signal from the second control loon 70 as more filly described below.

As the first control loop 20 responds to the error signal, the DSP 74 receives a digitized version through the converter ADC1. The digital signal is then analyzed over a series of samples to determine the optimum level of compensation for the power supply. In effect, the DSP and its associated algorithm can effectively implement a much higher order filter function than the simple RC scheme in a normal control loop, and it does it with a constant phase delay unlike a higher order filter implemented in analog components.

The dynamic loop filter function may be adaptive, that is, it can decide what to do based on the dv/dt determined by measurements of the previous N samples. For a very high negative dv/dt it can generate a high output to drive the loop on very hard. For positive dv/dt it can generate an output that's decreasing in level to prepare to settle at a final value.

Preferably, when the error amplifier signal goes below a threshold value, the output of the second control loop 70 should be zero. The main analog amplifier circuit 40 is under control of the loop. The DSP 74 only becomes active to provide dynamic response optimization during periods of time where the error amplifier 32 detects errors above a threshold value. This allows the statically compensated first control loop 20 to provide optimal accuracy during periods of static or slowly changing conditions.

The static and dynamic control signals are then summed, at the driver negative inputs, to produce an optimal compensation signal. The driver circuitry 56 receives the optimal signal and responds by appropriately driving the output stage 62 to source current to or sink current from the DUT 14. As the current demand is met, the supply voltage is maintained at the desired programmed level.

Figure 3:
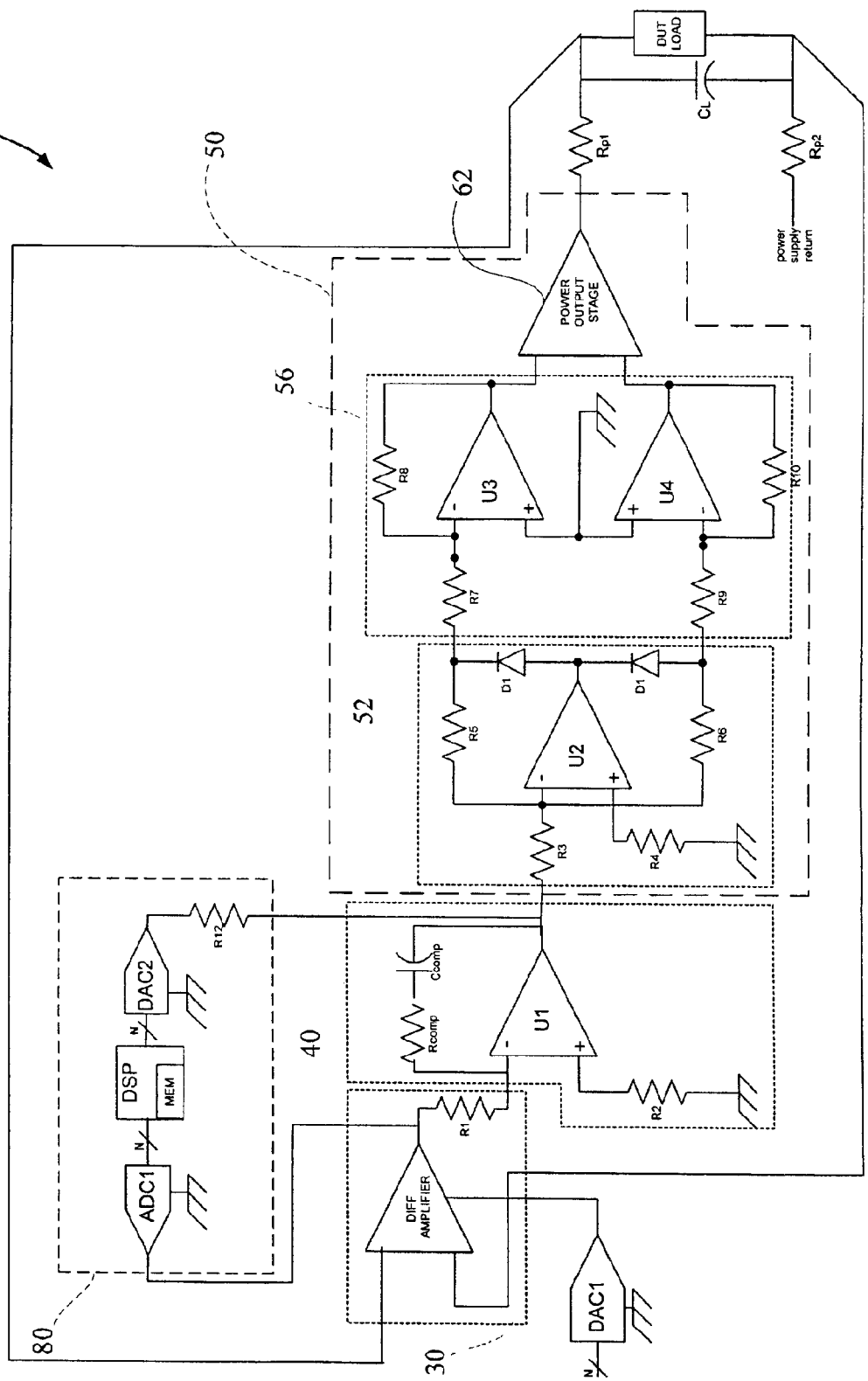
FIG. 3 is a block diagram similar to FIG. 2 showing a second embodiment of the present invention.

Referring now to FIG. 3, a second embodiment of the control circuit of the present invention simplifies the DSP circuit, generally designated 80, by reducing the number of DACs at the output to one, DAC1. The DAC output is then coupled to the output of the main loop amplifier 40 and summed with the linear compensation signal. This provides a cost effective way of implementing the present invention by minimizing components in the dynamic control loop. All other aspects of the second embodiment are similar to that described with respect to the first embodiment.

Those skilled in the art will appreciate the many benefits and advantages afforded by the present invention. Because of the programmable nature of the dynamic control loop in responding to variable load conditions, automatic compensation is realized without any external manual intervention. This omits the possibility of manual error relating to incorrect compensation settings. Moreover, by providing a dynamically responsive control circuit, the compensation can be truly optimized based on real-time output loading conditions rather than a predicted compromise setting.

While the invention has been particularly shown and described with reference to the preferred embodiments thereof, it will be understood by those skilled in the art that various changes in form and detail may be made therein without departing from the spirit and scope of the invention. For example, while the invention has been described primarily in the context of automatic test equipment, power supply technology has a broad array of applications, including computers and other electronic systems.

What is claimed is:

1. A control loop circuit for optimizing an output of a power supply under varying load conditions, the control loop circuit comprising:
   a first control path coupled to the output of the power supply, the first control path including an error amplifier having an output, the error amplifier operative to generate an error signal to a main loop amplifier, the error signal representing the difference between a desired output and a sensed output; and
   a second control path coupled to the output of the error amplifier and responsive to the error signal to generate a dynamic compensation signal, the second control path comprising:
      input conversion circuitry for converting the error signal into a digital signal;
      a digital-signal-processor coupled to the input conversion circuitry;
      a look-up table for storing optimal compensation signal responses to detected error signals, the digital-signal-processor operative in response to the digitized error signal to access the look-up table and identify the optimal compensation signal, and generating the optimal signal; and
      output conversion circuitry for connecting the optimal signal to the main loop amplifier output.

2. A control loop circuit according to claim 1 wherein:
   the look-up table comprises a RAM memory.

3. A control loop circuit according to claim 1 wherein the second control path is disposed in parallel with the first control path.

4. A control loop circuit according to claim 1 wherein:
   the second control path is selectively activated when the error signal is greater than a predetermined threshold.

5. A control loop circuit according to claim 1 wherein:
   the output conversion circuitry comprises a digital-to-analog converter.

6. A control loop circuit according to claim 1 wherein:
   the first control path includes respective source and sink signal paths; and
   the output conversion circuitry comprises respective source and sink digital-to-analog converters coupled to the respective source and sink signal paths.

7. A power supply system including:
   a main loop amplifier circuit;
   an output stage disposed in cascade with the main loop amplifier circuit; and
   a control loop circuit, the control loop circuit including
      a first control path coupled to the output stage and having an error amplifier, the error amplifier operative to generate an error signal to the main loop amplifier, the error signal representing the difference between a desired output and a sensed output; and
      a second control path coupled to the error amplifier output and responsive to the error signal to generate a dynamic compensation signal, the second control path comprising:
         input conversion circuitry for converting the error signal into a digital signal,
         a digital-signal-processor coupled to the conversion circuitry;
         a look-up table for storing optimal compensation signal responses to detected error signals, the digital-signal-processor operative in response to the digitized error signal to access the look-up table and identify the optimal compensation signal, and generating the optimal signal; and
         output conversion circuitry for connecting the optimal signal to the main loop amplifier output.

8. A power supply system according to claim 7 wherein:
   the look-up table comprises a RAM memory.

9. A power supply system according to claim 7 wherein the second control path is disposed in parallel with the first control path.

10. A power supply system according to claim 7 wherein:
    the second control path is selectively activated when the error signal is greater than a predetermined threshold.

11. A power supply system according to claim 7 wherein:
    the output conversion circuitry comprises a digital-to-analog converter.

12. A power supply system according to claim 7 wherein:
    the first control path includes respective source and sink signal paths; and
    the output conversion circuitry comprises respective source and sink digital-to-analog converters coupled to the respective source and sink signal paths.

13. A method of controlling the output of a device under test (DUT) power supply, the method comprising:
    generating a first compensated error signal based on the difference between a desired power supply output and an actual power supply output;

producing a dynamically compensated error signal in parallel with the first compensated error signal, producing comprising:

convening the first compensated error signal into a digital signal;

analyzing the digital signal;

generating a digital dynamically compensated error signal based on the analyzing the digital signal;

convening the digital dynamically compensated error signal to an analog dynamically compensated error signal; and summing the first compensated error signal and the analog dynamically compensated error signals to generate an optimal compensation signal.

14. A method according to claim 13 wherein producing comprises being dependent on the magnitude of the first compensated error signal being above a pre-set threshold.

* * * * *